United States Patent
Yoshida

(10) Patent No.: US 6,411,168 B2
(45) Date of Patent: Jun. 25, 2002

(54) VOLTAGE-CONTROLLED OSCILLATOR AND COMMUNICATION APPARATUS USING SAME

(75) Inventor: Daisuke Yoshida, Moriyama (JP)

(73) Assignee: Murata Manufacturing, Co. Ltd., Kyoto (JP)

( * ) Notice: Subject to any disclaimer, the term of this patent is extended or adjusted under 35 U.S.C. 154(b) by 0 days.

(21) Appl. No.: 09/789,362

(22) Filed: Feb. 21, 2001

(30) Foreign Application Priority Data

Feb. 21, 2000 (JP) ........................................ 2000-042675

(51) Int. Cl.[7] .................. H03B 5/08; H03B 5/12; H03B 5/18
(52) U.S. Cl. .................. 331/49; 331/117 R; 331/117 D; 331/175; 331/179
(58) Field of Search ............................... 331/49, 117 R, 331/117 FE, 117 D, 175, 179

(56) References Cited

U.S. PATENT DOCUMENTS

| | | | | |
|---|---|---|---|---|
| 5,115,209 A | * | 5/1992 | Grace et al. .................. | 331/49 |
| 5,200,713 A | * | 4/1993 | Grace et al. .................. | 331/49 |
| 5,852,384 A | * | 12/1998 | Sakakura et al. ............. | 331/48 |
| 5,982,240 A | * | 11/1999 | Hayashi ........................ | 331/40 |
| 5,982,243 A | * | 11/1999 | Pope ............................ | 331/59 |
| 5,999,061 A | * | 12/1999 | Pope et al. .................... | 331/49 |
| 6,288,615 B1 | * | 9/2000 | Kobayashi ..................... | 331/49 |
| 6,292,063 B1 | * | 9/2001 | Tanemura et al. ............. | 331/49 |
| 6,294,961 B1 | * | 9/2001 | Baba ............................ | 331/49 |

FOREIGN PATENT DOCUMENTS

JP          11-168324          6/1999

* cited by examiner

*Primary Examiner*—David Mis
(74) *Attorney, Agent, or Firm*—Keating & Bennett, LLP

(57) ABSTRACT

A voltage-controlled oscillator is constructed to greatly reduce the number of parts required, its overall size, and manufacturing cost. The voltage-controlled oscillator includes first and second resonance circuits, first and second oscillation circuits, a buffer circuit amplifying the oscillation signals output from the first and second oscillation circuits, and an output-matching circuit. In addition, the voltage-controlled oscillator includes a first switching circuit for controlling the oscillation of the first oscillation circuit and a second switching circuit for controlling the oscillation of the second oscillation circuit. The impedance changing of the matching circuit is simultaneously performed while switching between the switching circuits.

22 Claims, 3 Drawing Sheets

VOLTAGE-CONTROLLED OSCILLATOR AND COMMUNICATION APPARATUS USING SAME

BACKGROUND OF THE INVENTION

1. Field of the Invention

The present invention relates to voltage-controlled oscillators used in various kinds of high-frequency circuits and communication apparatuses incorporating the same.

2. Description of the Related Art

A conventional voltage-controlled oscillator oscillating at two different frequencies is disclosed in Japanese Unexamined Patent Application Publication No. 11-168324. FIG. 4 shows the structure of the voltage-controlled oscillator described in this publication.

FIG. 4 illustrates the voltage-controlled oscillator including a resonance circuit 2, an oscillation circuit 3, a buffer circuit 4, and a matching circuit 5. The resonance circuit 2 operates to select one of two different frequencies, and resonates at the selected frequency. For example, the resonance circuit includes two resonance circuits resonating at different resonant frequencies, respectively, each of which selects one of the resonant frequencies. Otherwise, the resonance circuit includes inductors and capacitors. The resonant frequency of each resonance circuit is switched by switching the inductance or the capacitance. In FIG. 4, the reference character Vf denotes a switching signal used for allowing the resonance circuit to resonate at one of the two resonant frequencies.

The oscillation circuit 3 has a transistor TR1, a capacitor C7 connected between the base of the transistor TR1 and the emitter thereof, a capacitor C6 connected between the emitter thereof and a ground, and a capacitor C5 connected between the collector of the transistor TR1 and a ground.

The buffer circuit 4 has a transistor TR3. A signal output from the emitter of the transistor TR1 is input to the base of the transistor TR3 via a capacitor C8, and an output signal Vout is transmitted from the collector of the transistor TR3 via a capacitor C2.

The matching circuit 5 includes inductors L1, L2, and a capacitor C3. One end of the inductor L1 is connected to the collector of the transistor TR3, and one end of the inductor L2 is connected to a power source Vsc. A capacitor C12 and a diode D2 are connected between a junction of the inductors L1 and L2 and a ground. A switching signal Vsw is supplied to the diode D2 via a resistor R10.

In the voltage-controlled oscillator having the above-described structure, an oscillation frequency to be used can be switched, for example, from the 800-MHz band to the 1.6-GHz band. In other words, the oscillation circuit 3 oscillates at a resonant frequency determined by the capacitors C5, C6, and C7, and the resonance circuit 2. Then, the transistor TR3 buffer-amplifies the oscillation-frequency signal to output as Vout. Then, according to the oscillation frequency, the diode D2 is switched ON/OFF by the switching signal Vsw so that the impedance of the matching impedance 5 is changed.

Such a voltage-controlled oscillator switching the oscillation frequency between the two oscillation frequencies is used in a mobile phone using two kinds of communication systems having different frequency bands. In order to miniaturize a communication apparatus by taking advantage of a single voltage-controlled oscillator adaptable to two frequencies, it is necessary to reduce the size of the entire structure including circuits disposed in the voltage-controlled oscillator.

However, the conventional voltage-controlled oscillator requires a switching circuit for switching the oscillation frequencies and also requires a switching circuit for changing the impedance of the matching circuit. Therefore, it is necessary for a substrate to have areas where components constituting such switching circuits are arranged. As a result, it is difficult to achieve both miniaturization and cost reduction of voltage-controlled oscillators.

SUMMARY OF THE INVENTION

In order to overcome the problems described above, preferred embodiments of the present invention provide a voltage-controlled oscillator that greatly reduces the number of parts used, the overall size, and the manufacturing cost. Also, preferred embodiments of the present invention provide a communication apparatus incorporating the novel voltage-controlled oscillator.

According to a first preferred embodiment of the present invention, a voltage-controlled oscillator includes a first resonance circuit and a second resonance circuit resonating at different frequencies, a first oscillation circuit amplifying an output signal from the first resonance circuit so as to oscillate, a second oscillation circuit amplifying an output signal from the second resonance circuit so as to oscillate, a buffer circuit amplifying the output signals from the first and second oscillation circuits, a first switching circuit for controlling oscillation which is connected to the first oscillation circuit, a second switching circuit for controlling oscillation which is connected to the second oscillation circuit, and a matching circuit having an impedance that is capable of being changed by switching between the first switching circuit and the second switching circuit to match with an oscillation frequency of one of the first and second oscillation circuits.

In the above-described unique structure, the impedance of the matching circuit is changed by switching between the oscillation-controlling first and second switching circuits. With this arrangement, it is not necessary to provide a separate switching circuit for switching an oscillation frequency and another switching circuit for changing the impedance of the matching circuit. As a result, the number of required components is reduced, and the required component areas on a substrate are thereby reduced. Thus, the entire size of the oscillator and the manufacturing cost thereof are greatly reduced.

According to a second preferred embodiment of the present invention, a voltage-controlled oscillator includes a resonance circuit resonating at one of two different frequencies, an oscillation circuit amplifying an output signal from the resonance circuit so as to oscillate, a buffer circuit amplifying an output signal from the oscillation circuit, a switching circuit connected to the resonance circuit to select one of the resonance frequencies, and a matching circuit having an impedance that is changed by switchover in the switching circuit to match with an oscillation frequency of the oscillation circuit.

As described above, since the impedance of the matching circuit is changed by the switchover in the switching circuit connected to the resonance circuit to select one of the resonance frequencies, it is unnecessary to provide a separate switching circuit for performing the switchover according to the oscillation frequencies and another switching circuit for changing the impedance of the matching circuit. Thus, the number of required components is reduced and component areas on a substrate are thereby minimized, such that miniaturization of the overall size of the oscillator and reduction in manufacturing cost are achieved.

According to a third preferred embodiment of the present invention, a communication apparatus includes at least one of the voltage-controlled oscillator of the other preferred embodiments of the present invention. For example, the communication apparatus modulates a transmission frequency according to transmitted signals (data) and switches between the frequency bands according to communication systems.

Other features, elements, characteristics and advantages of the present invention will become more apparent from the detailed description of preferred embodiments thereof with reference to the attached drawings.

DETAILED DESCRIPTION OF PREFERRED EMBODIMENTS

Figure 1:
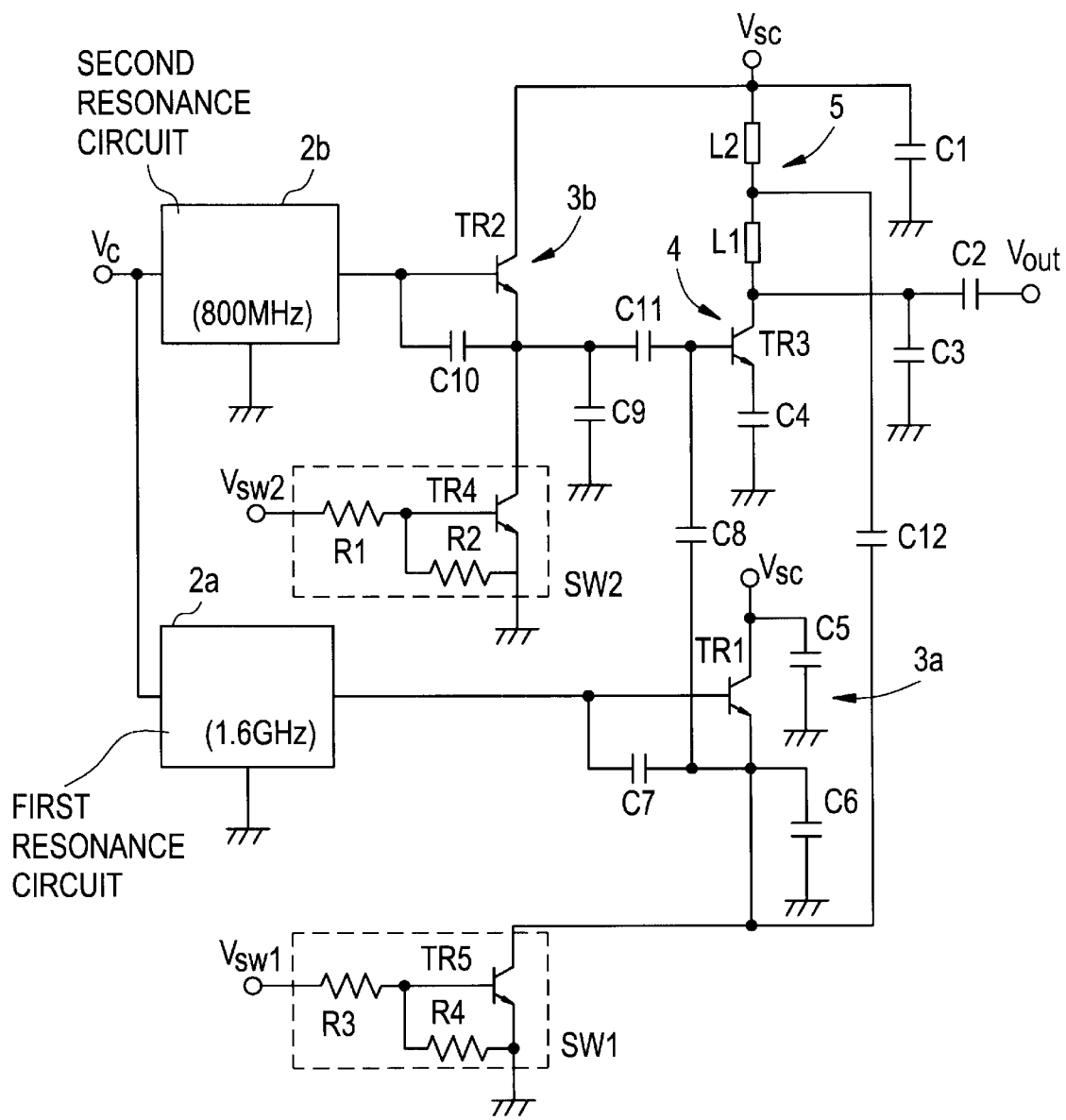
FIG. 1 is a circuit diagram illustrating the structure of a voltage-controlled oscillator according to a first preferred embodiment of the present invention.

FIG. 1 shows the structure of a voltage-controlled oscillator according to a first preferred embodiment of the present invention.

The voltage-controlled oscillator preferably includes a first resonance circuit 2a, a second resonance circuit 2b, a first oscillation circuit 3a, a second oscillation circuit 3b, a buffer circuit 4, a matching circuit 5, a switching circuit SW1, and a switching circuit SW2.

The resonance circuit 2a and the second resonance circuit 2b preferably have different resonant frequencies. For example, the first resonance circuit 2a resonates at a frequency band of about 900 MHz, and the second resonance circuit 2b resonates at a frequency band of about 1.8 GHz. The first oscillation circuit 3a defines a deformed Colpitts-type oscillation circuit including a transistor TR1, capacitors C5, C6, and C7, and the first resonance circuit 2a. In other words, the collector of the TR1 is grounded in a high frequency manner via the capacitor C5. This is equivalent to a situation in which a synthesized capacitance of the capacitors C5 and C6 is connected between the collector of the transistor TR1 and the emitter thereof. In addition, it is also equivalent to a situation in which the first resonance circuit 2a is connected between the collector of the transistor TR1 and the base thereof. Thus, the first oscillation circuit 3a oscillates at the resonant frequency of the first resonance circuit 2a. However, depending on the configuration of the first resonance circuit 2a, the resonant frequency is affected by the capacitors C5, C6, and C7. In this case, the first oscillation circuit 3a oscillates at a resonant frequency determined by the first resonance circuit 2a and the capacitors C5, C6, and C7. Similarly, the second oscillation circuit 3b defines a deformed Colpitts-type oscillation circuit including a transistor TR2, capacitors C1, C9, and C10, and the second resonance circuit 2b. In other words, the collector of the TR2 is grounded in a high frequency manner via the capacitor C1, and this is equivalent to a situation in which the synthesized capacitance of the capacitors C1 and C9 is connected between the collector of the transistor TR2 and the emitter thereof. In addition, the second resonance circuit 2b is connected between the collector of the transistor TR2 and the base thereof. With this arrangement, the second oscillation circuit 3b oscillates at the resonant frequency of the second resonance circuit 2b. However, depending on the configuration of the second resonance circuit 2b, the resonant frequency is affected by the capacitors C1, C9, and C10. In this case, the second oscillation circuit 3b oscillates at a resonant frequency determined by the second resonance circuit 2b and the capacitors C1, C9, and C10.

The buffer circuit 4 receives an oscillation signal from the first oscillation circuit 3a via a capacitor C8 or receives an oscillation signal from the second oscillation circuit 3b via a capacitor C11 to buffer-amplify each signal and provide an output signal via a capacitor C2. The matching circuit 5 performs output matching by the synthesized impedance of inductors L1, L2, and a capacitor C3.

The first switching circuit SW1 preferably includes a transistor TR5, a resistor R3, and a resistor R4. The transistor TR5 is connected between the emitter of the transistor TR1 of the first oscillation circuit and a ground. The first switching circuit SW1 switches ON/OFF the transistor TR5 in response to a switching signal Vsw1. When the transistor TR5 is switched ON, the emitter of the transistor TR1 is grounded and the first oscillation circuit 3a thereby oscillates. When the transistor TR5 is switched OFF, the emitter of the transistor TR1 is opened, which stops the oscillation of the first oscillation circuit 3a.

Similarly, the second switching circuit SW2 preferably includes a transistor TR4, a resistor R1, and a resistor R2. The transistor TR4 is connected between the emitter of the transistor TR2 of the second oscillation circuit and a ground. The second switching circuit SW2 switches ON/OFF the transistor TR4 in response to a switching signal Vsw2. When the transistor TR4 is switched ON, the emitter of the transistor TR2 is grounded and the second oscillation circuit 3b thereby oscillates. When the transistor TR4 is switched OFF, the emitter of the transistor TR2 is opened, which stops the oscillation of the second oscillation circuit 3b.

In FIG. 1, in order to allow the voltage-controlled oscillator to oscillate at the frequency band of about 1.8 GHz, a predetermined positive-potential signal is input to the port of the switching signal Vsw1. In this situation, a ground potential is applied to the port of the switching signal Vsw2. With this arrangement, the transistor TR5 is switched ON and the emitter of the transistor TR1 is thereby grounded via the transistor TR5. As a result, the first oscillation circuit 3a oscillates. In addition, at this time, the transistor TR4 is switched OFF, and the emitter of the transistor TR2 is opened. As a result, the second oscillation circuit 3b does not oscillate. The oscillation signal of the first oscillation circuit 3a is amplified by the transistor TR3 to be output as a signal Vout. In this situation, a connection point between the inductor L2 and the inductor L1 is grounded via a capacitor C12 and the transistor TR5, and the synthesized impedance of the matching circuit 5 is thereby determined by the inductor L1 and the capacitor C3. Thus, the matching circuit 5 performs output matching in the 1.8 GHz band.

Next, in order to allow the voltage-controlled oscillator to oscillate at a frequency band of about 900 MHz, a predetermined positive-potential signal is input to the port of the switching signal Vsw2. In this situation, a ground potential is applied to the port of the switching signal Vsw1. Then the transistor TR4 is switched ON and the emitter of the transistor TR2 is thereby grounded via the transistor TR4. As a result, the second oscillation circuit 3b oscillates. In addition, at this time, the transistor TR5 is switched OFF, the emitter of the TR1 is opened and the first oscillation circuit 3a thereby does not oscillate. The oscillation signal of the second oscillation circuit 3b is amplified by the transistor TR3 to be output as a signal Vout. The synthesized impedance of the matching circuit 5 is determined by a series circuit of the inductors L1 and L2, and the capacitor C3. As a result, the matching circuit 5 performs output matching in the 900 MHz band.

The first and second resonance circuits 2a and 2b may include resonators defined by microstrip lines and variable reactance elements such as varactor diodes to change the reactance of the reactance elements by a control voltage Vc. Thus, the resonance frequencies of the first and second resonance circuits 2a and 2b are changed by the control voltage Vc. With this arrangement, the oscillation frequency can be modulated by the control voltage Vc.

Figure 2:
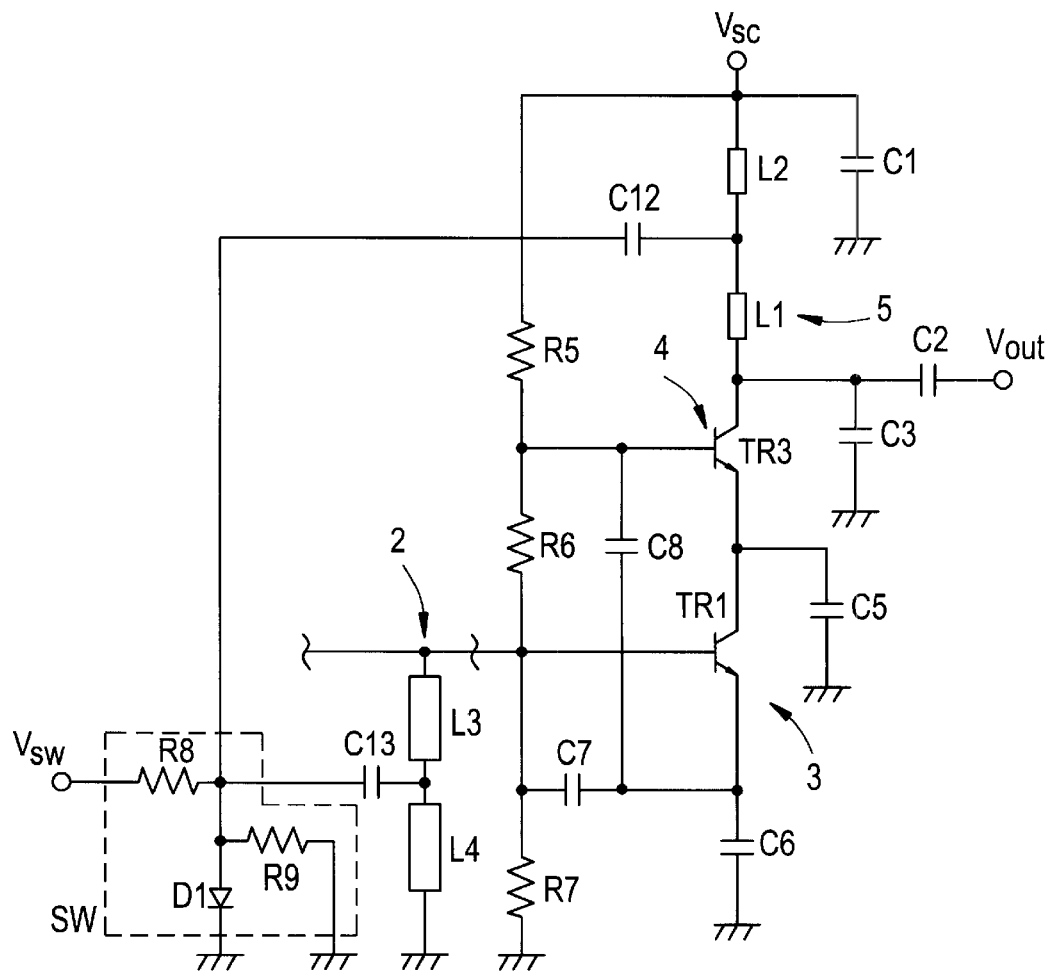
FIG. 2 is a circuit diagram illustrating the structure of a voltage-controlled oscillator according to a second preferred embodiment of the present invention.

Next, FIG. 2 illustrates the structure of a voltage-controlled oscillator according to a second preferred embodiment of the present invention.

The voltage-controlled oscillator preferably includes a resonance circuit 2, an oscillation circuit 3, a buffer circuit 4, a matching circuit 5, and a switching circuit SW.

The resonance circuit 2 preferably includes microstrip line resonators L3 and L4. The resonant frequencies of the resonators determine oscillation frequencies. Additionally, in response to the capacitances of the capacitors C7, C6, and C5 included in the oscillation circuit 3, the oscillation frequency is slightly influenced.

The resistors R5, R6, and R7 determine a base-bias voltage of each of the transistors TR1 and TR3. The switching circuit SW preferably includes a diode D1 and resistors R8 and R9. The diode D1 is connected between a connection point of the inductors L1 and L2 of the matching circuit 5 and a ground via a capacitor C12. In addition, the diode D1 is connected between a connection point of the microstrip lines L3 and L4 of the resonance circuit 2 and a ground via a capacitor C13.

First, in order to allow the voltage-controlled oscillator shown in FIG. 2 to oscillate at a frequency band of 1.8 GHz, a predetermined positive potential as a switching signal Vsw is applied to the port of the Vsw. With this application, since the diode D1 is switched ON, the inductor L4 is equivalently grounded. As a result, the resonant frequency of the resonator is determined by the microstrip line L3 and the resonator resonates at the frequency of about 1.8 GHz. The oscillation circuit oscillates at the resonant frequency. At the same time, the inductor L2 of the matching circuit 5 is grounded, thereby a value of the synthesized impedance of the matching circuit 5 is determined by the inductor L1 and the capacitor C3. Thus the matching circuit 5 matches with the about 1.8 GHz band.

Next, in order to allow the voltage-controlled oscillator to oscillate at a frequency band of about 900 MHz, a ground potential or a predetermined negative potential is applied as a switching signal Vsw to the port of the Vsw. With this application, the diode D1 is switched OFF and the resonant frequency of the resonator is determined by the microstrip lines L3 and L4 and the resonator resonates at the frequency of about 900 MHz. As a result, the oscillation circuit 3 oscillates at the resonant frequency. At the same time, the value of the synthesized impedance of the matching circuit 5 is determined by the inductors L1 and L2, and the capacitor C3. Thus, the matching circuit 5 matches with the about 900 MHz band.

In the example shown in FIG. 2, the oscillation frequency is switched only between two levels. Alternatively, the oscillation frequency may be controlled by arranging a circuit in such a manner that a variable reactance element such as a varactor diode is connected to the resonance circuit 2 to change the reactance of the variable reactance element according to a control voltage.

Figure 3:
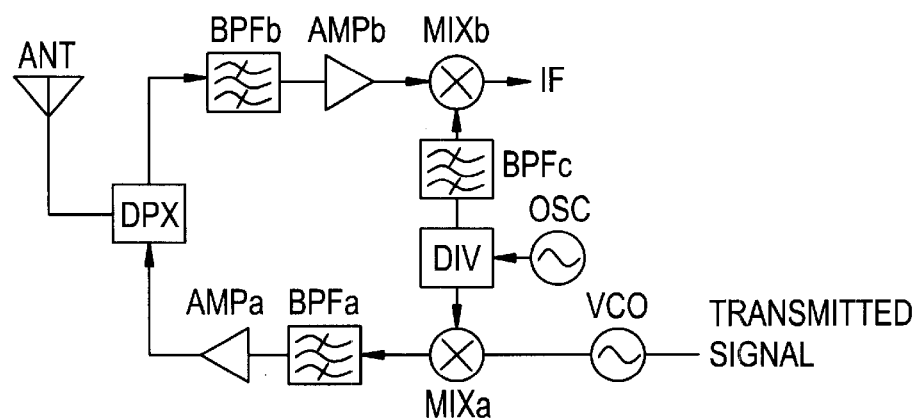
FIG. 3 is a block diagram illustrating the structure of a communication apparatus according to a third preferred embodiment of the present invention.
Figure 4:
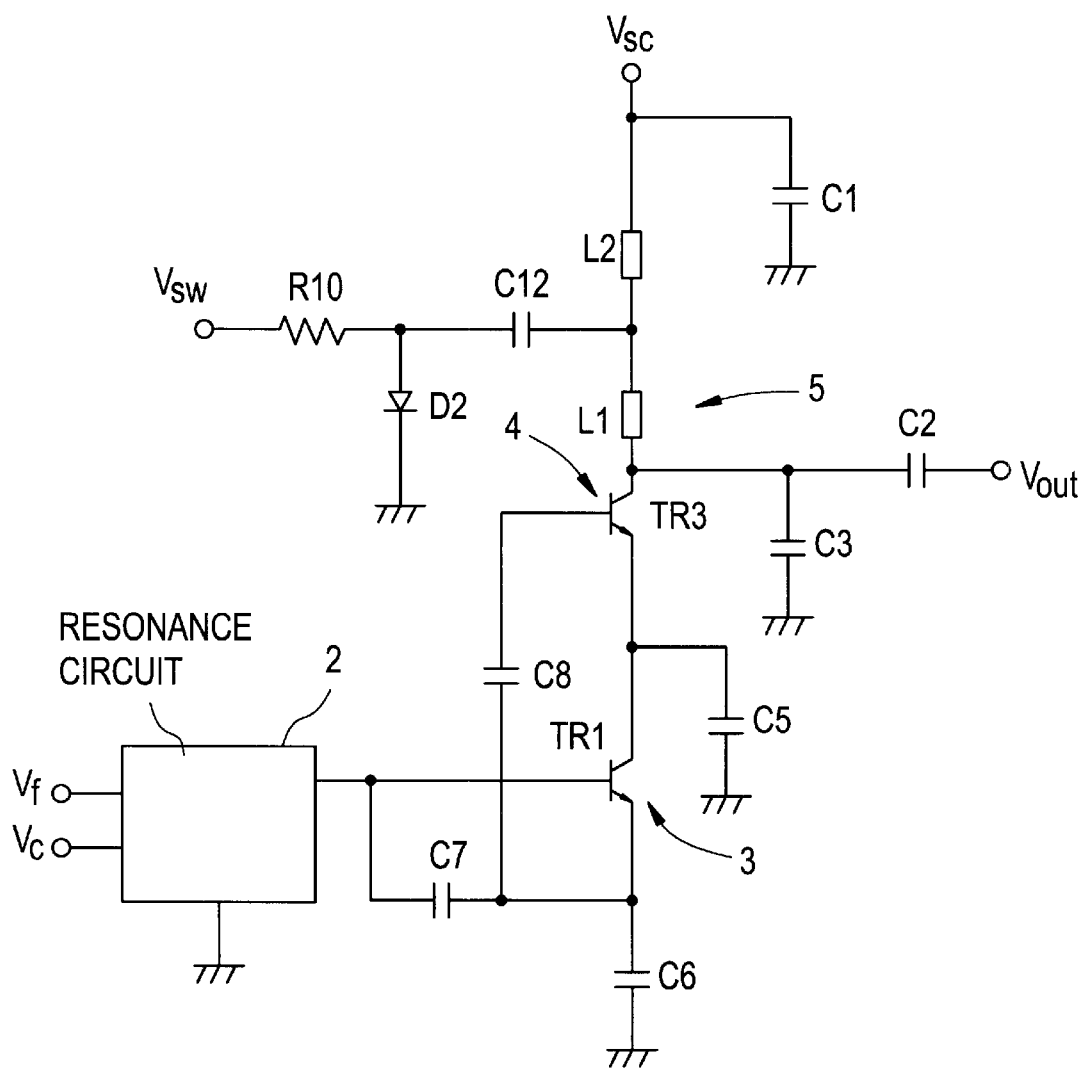
FIG. 4 is a circuit diagram illustrating the structure of a conventional voltage-controlled oscillator.

Next, FIG. 3 shows the structure of a communication apparatus according to a third preferred embodiment of the present invention. In FIG. 3, the reference character ANT denotes a transmission/reception antenna, the reference character DPX denotes a duplexer, the reference characters BPFa, BPFb, and BPFc denote band pass filters. The reference characters AMPa and AMPb denote amplifying circuits. The reference characters MIXa and MIXb denote mixers. The reference character OSC denotes an oscillator, and the reference character DIV denotes a power divider. The reference character VCO denotes a voltage-controlled oscillator modulating the oscillation frequency thereof by a signal in accordance with a transmitted signal (transmitted data).

The mixer MIXa modulates a frequency signal output from the divider DIV by a modulation signal, and the band pass filter BPFa passes the signal only through the transmitted-frequency band. The amplifier AMPa performs power-amplification of the passed signal, the signal is outputted from the antenna ANT via the duplexer DPX. The band pass filter BPFb passes only signals of the received frequency band among signals supplied from the duplexer DPX, and the amplifying circuit AMPb amplifies the passed signals. The mixer MIXb mixes a frequency signal supplied from the band pass filter BPFc with the received signal to produce an intermediate frequency signal IF.

The voltage-controlled oscillator shown in FIGS. 1 and 2 is preferably used as the VCO shown in FIG. 3. For example, when the VCO is used in a mobile phone of the GSM system, the VCO oscillates at the frequency of 900 MHz. When used in the mobile phone of the DCS system, the VCO oscillates at the frequency of 1.8 GHz. As shown here, a compact communication apparatus can be obtained by using a compact voltage-controlled oscillator while reducing the area on a substrate that is occupied by the voltage-controlled oscillator.

As described above, in the voltage-controlled oscillator according to the first and second preferred embodiments of the present invention, it is unnecessary to provide a separate switching circuit for switching between the oscillation frequencies and a separate switching circuit for changing the impedance of the matching circuit. As a result, the number of required parts is reduced and the component areas on the substrate are minimized. The entire miniaturization and cost reduction of the voltage-controlled oscillator are also achieved.

Furthermore, according to the third preferred embodiment of the present invention, a highly compact and low-priced communication apparatus is obtained by using the compact voltage-controlled oscillator according to either the first or second preferred embodiments, while reducing an area of the voltage-controlled oscillator on the substrate.

While the preferred embodiments of the present invention have been described above, it is to be understood that modifications will be apparent to those skilled in the art without departing from the spirit of the present invention. The scope of the present invention, therefore, is to be determined solely by the following claims.

What is claimed is:

1. A voltage-controlled oscillator comprising:
   a first resonance circuit and a second resonance circuit resonating at different frequencies;
   a first oscillation circuit amplifying an output signal from the first resonance circuit so as to oscillate and a second oscillation circuit amplifying an output signal from the second resonance circuit so as to oscillate;
   a buffer circuit amplifying signals output from the first and second oscillation circuits;
   a first switching circuit controlling oscillation of the first oscillation circuit and a second switching circuit controlling oscillation of the second oscillation circuit; and
   a matching circuit having an impedance that is changed by switching between the first switching circuit and the second switching circuit to match with an oscillation frequency of one of the first and second oscillation circuits.

2. A voltage-controlled oscillator according to claim 1, wherein the first resonance circuit resonates at a frequency band of about 900 MHz.

3. A voltage-controlled oscillator according to claim 1, wherein the second resonance circuit resonates at a frequency band of about 1.8 GHz.

4. A voltage-controlled oscillator according to claim 1, wherein the first oscillation circuit comprises a deformed Colpitts-type oscillation circuit.

5. A voltage-controlled oscillator according to claim 4, wherein the deformed Colpitts-type oscillation circuit includes a transistor, a plurality of capacitors, and the first resonance circuit.

6. A voltage-controlled oscillator according to claim 1, wherein the first oscillation circuit oscillates at the resonant frequency of the first resonance circuit.

7. A voltage-controlled oscillator according to claim 1, wherein the second oscillation circuit comprises a deformed Colpitts-type oscillation circuit.

8. A voltage-controlled oscillator according to claim 7, wherein the deformed Colpitts-type oscillation circuit includes a transistor, a plurality of capacitors, and the second resonance circuit.

9. A voltage-controlled oscillator according to claim 1, wherein the second oscillation circuit oscillates at the resonant frequency of the second resonance circuit.

10. A voltage-controlled oscillator according to claim 1, wherein the buffer circuit buffer-amplifies each signal output from the first and second oscillation circuits and provides buffer-amplified output signals.

11. A voltage-controlled oscillator according to claim 1, wherein the matching circuit matches the synthesized impedance of a plurality of inductors and at least one capacitor.

12. A voltage-controlled oscillator according to claim 1, wherein the first switching circuit includes a transistor and at least two resistors.

13. A voltage-controlled oscillator according to claim 1, wherein the second switching circuit includes a transistor and at least two resistors.

14. A voltage-controlled oscillator according to claim 1, wherein the first and second resonance circuits include resonators defined by microstrip lines and variable reactance elements to change the reactance of the reactance elements by a control voltage.

15. A voltage-controlled oscillator according to claim 14, wherein the resonance frequencies of the first and second resonance circuits are changed by the control voltage.

16. A communication apparatus comprising the voltage-controlled oscillator according to claim 1.

17. A voltage-controlled oscillator comprising:
    a resonance circuit resonating at one of two different frequencies;
    an oscillation circuit amplifying an output signal from the resonance circuit so as to oscillate;
    a buffer circuit amplifying an output signal from the oscillation circuit;
    a switching circuit connected to the resonance circuit to select one of the resonant frequencies; and
    a matching circuit having an impedance that is changed by switchover in the switching circuit to match with an oscillation frequency of the oscillation circuit.

18. A voltage-controlled oscillator according to claim 17, wherein the resonance circuit includes microstrip line resonators.

19. A voltage-controlled oscillator according to claim 17, wherein the oscillation circuit includes a plurality of capacitors.

20. A voltage-controlled oscillator according to claim 17, wherein the switching circuit includes a diode and at least two resistors.

21. A voltage-controlled oscillator according to claim 17, wherein the voltage-controlled oscillator oscillators at one of a frequency band of about 1.8 GHz and a frequency band of about 900 MHz.

22. A communication apparatus comprising the voltage-controlled oscillator according to claim 17.

* * * * *